United States Patent

Jo

[11] Patent Number: 5,978,232
[45] Date of Patent: Nov. 2, 1999

[54] COMPUTER BODY WITH A FIXING DEVICE

[75] Inventor: Whan-Haeng Jo, Seoul, Rep. of Korea

[73] Assignee: SamSung Electronics Co., Ltd., Suwon, Rep. of Korea

[21] Appl. No.: 08/773,519

[22] Filed: Dec. 23, 1996

[30] Foreign Application Priority Data

Apr. 22, 1996 [KR] Rep. of Korea ...................... 96-12201

[51] Int. Cl.⁶ .................................................. H05K 7/14
[52] U.S. Cl. ........................... 361/796; 361/752; 361/753; 361/759; 211/41.17; 312/223.2
[58] Field of Search .................................. 361/752, 818, 361/816, 732, 736, 740, 747, 748, 753, 756, 759, 796, 799, 800, 801, 802; 174/35 R; 211/41.17; 312/223.1, 223.2

[56] References Cited

U.S. PATENT DOCUMENTS

| | | | |
|---|---|---|---|
| 3,066,367 | 12/1962 | Garman | 248/222.1 |
| 3,486,077 | 12/1969 | Oeler et al. | 361/752 |
| 4,470,178 | 9/1984 | Matsui | 24/289 |
| 4,495,380 | 1/1985 | Ryan et al. | 174/138 D |
| 4,604,776 | 8/1986 | Takahashi | 174/138 D |
| 4,938,703 | 7/1990 | Nakano | 439/74 |
| 4,966,482 | 10/1990 | Fujimoto | 403/24 |
| 5,191,513 | 3/1993 | Sugiura et al. | 361/752 |
| 5,218,760 | 6/1993 | Colton et al. | 29/845 |
| 5,281,149 | 1/1994 | Petri | 439/66 |
| 5,345,366 | 9/1994 | Cheng et al. | 361/785 |

*Primary Examiner*—Leo P. Picard
*Assistant Examiner*—Jayprakash N. Gandhi
*Attorney, Agent, or Firm*—Robert E. Bushnell, Esq.

[57] ABSTRACT

A computer body having a chassis, a motherboard, and a number of stanchions to secure the motherboard to the chassis while separating the motherboard from the chassis. The stanchion disclosed in this invention is easy to make and manufacture, as it is made from just one part. The stanchion is easy to install and disassemble. The invention requires holes be made in the chassis to accommodate and fix the stanchions to the chassis. In addition, the invention requires holes in the motherboard to accommodate a screw to fasten the motherboard to the tops of the stanchions. The invention allows a wide variety of motherboards to be installed in a single chassis without requiring the manufacture of a new chassis each time a slightly different motherboard is used. Also, the present invention prevents the motherboard form shaking and vibrating when the computer device is being handled or moved.

7 Claims, 4 Drawing Sheets

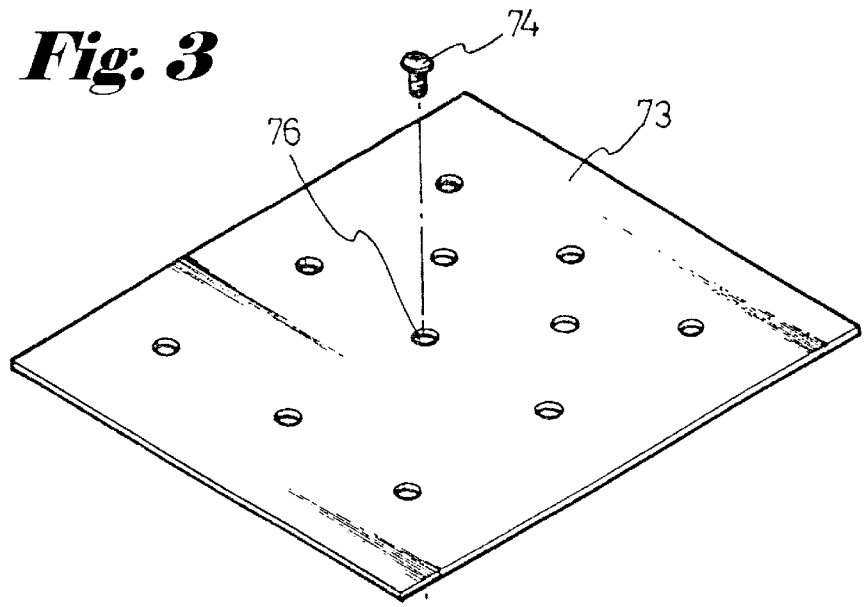
Fig. 3
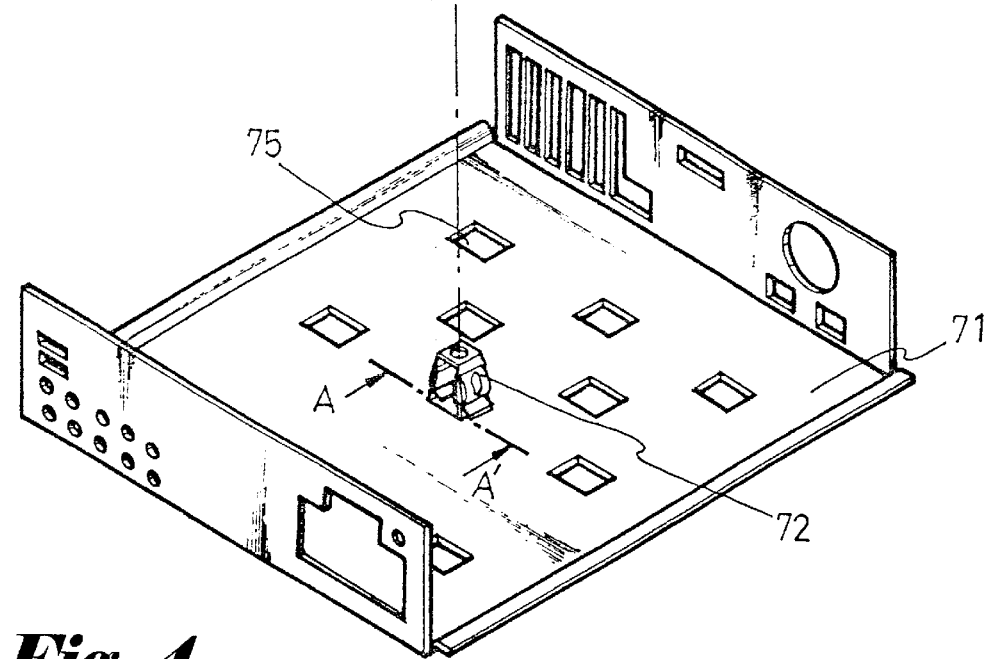
Fig. 4
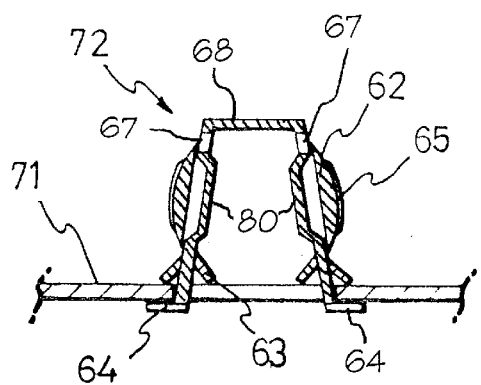

5,978,232

COMPUTER BODY WITH A FIXING DEVICE

CROSS-REFERENCE TO RELATED APPLICATIONS

This application makes reference to, incorporates the same herein, and claims all benefits accruing under 35 U.S.C. §119 arising from an application for A Computer Body with a Fixing Device earlier filed in the Korean Industrial Property Office on Apr. 22, 1996 and there duly assigned Ser. No. 12201/1996.

FIELD OF THE INVENTION

The present invention relates to a computer body containing an electronic computer device containing a chassis, a printed circuit board, and stand-off units separating the printed circuit board from the chassis. The disclosure focuses on the stand-off units or stanchions themselves as well as in their application.

BACKGROUND OF THE INVENTION

Electronic computer devices are generally enclosed in a metallic housing called a chassis. The metallic housing prevents electromagnetic interference from either entering or leaving the device. It also provides for the physical structure for the device. The electronic circuitry found within is often composed of integrated circuit chips such as a CPU, placed on a printed circuit board, sometimes referred to as a motherboard. This motherboard must be physically fixed to the chassis so that the motherboard does not vibrate and wobble when the electronic computer is being transported, handled, or installed or used. In addition, this motherboard must have adequate support so that it does not bow or warp in places. Lastly, the motherboard must not be allowed to unintentionally form electrical contact with the grounded chassis of the device. Therefore, devices called stand-off units, sometimes referred to as stanchions or standards, are used to mount the printed circuit board on the chassis while maintaining a predetermined distance of separation between the printed circuit board and the chassis.

The prior art contains numerous designs for stand-off units. FIG. 1 discloses a earlier stand-off unit. Nuts or lugs are integrally formed with the chassis, requiring that motherboards installed in the chassis of FIG. 1 must use all of the lugs 20 to prevent unwanted and unintentional shorting. Thus, a new chassis with a new lug arrangement had to be created each time a new motherboard containing a slightly different through hole arrangement was employed. U.S. Pat. No. 3,066,367 for a Panel Mounting Fastener to German discloses another earlier design for a stand-off unit. Fastening clips mounted on the base of the chassis and positioned around the circuit board allow for a variety of printed circuit boards to be installed in the same chassis. However, one drawback is that Garman's design is inadequate if the motherboard should be large, as there is no support for the motherboard in the center, allowing the motherboard to sag or warp downward. A more sophisticated design to alleviate the above problem can be found in U.S. Pat. No. 4,604,776 for a Spacer For Mounting Boards to Takahashi. Takahashi shows a unit that is easy to install and remove, and can be installed in the middle as well as near the edge of the motherboard. However, Takahashi is just a spacer, as it fails to secure the motherboard to the chassis, thus failing to prevent the motherboard inside the chassis from shaking and vibrating.

U.S. Pat. No. 5,345,366 for a Substrate to Substrate Standoff Assembly to Cheng et al. discloses an interconnect and standoff assembly that provides for electrical coupling between the chassis and the motherboard. In addition, a screw is inserted into a hole formed in the motherboard to attach the stand-off unit to the motherboard. Cheng requires many holes to be formed for each stand-off unit inserted, thus increasing machining costs. Also, Cheng's assembly is made up of more than one part, thus complicating the machining and the assembly of the standoff unit.

Finally, U.S. Pat. No 4,470,178 for a Fastener to Matsui, U.S. Pat. No. 5,191,513 for a Securing Device to Sugiura et al, and U.S. Pat. No. 4,495,380 for a Combined Metal And Plastic Standoff to Ryan et al. each disclose resilient standoff units used to fasten a motherboard to a chassis at a predetermined distance. The drawback with each of these devices is that each are composed of numerous parts, which are difficult to manufacture and assemble.

What is needed is a design for a stand-off unit that is easy to manufacture, that can easily be attached to a detached from a hole in a computer chassis, and that firmly supports and attaches a variety of printed circuit boards of all sizes, including large sizes, to computer chassis.

SUMMARY OF THE INVENTION

Accordingly, it is an object to provide a chassis for the housing encasing a computer.

It is another object to provide a simple and an improved design for a stanchion that separates but securely attaches a printed circuit board to a chassis of a computer's housing.

It is yet another object to provide a single computer chassis, that, together with a number of fastening stanchions, can securely fasten and accommodate motherboards and printed circuitboards having a wide variety of sizes and having a wide variety of through hole arrangements to the single computer chassis.

It is still also another object to provide a stanchion that is easy and inexpensive to manufacture and assemble.

It is still yet another object to provide a single integrated, easily removable bracket able to securely attach a printed circuit board to a chassis while holding the circuit board separated by a fixed distance from the chassis.

It is a further object to provide an integrated bracket that can be installed in a chassis with two fingers and can be removed from the chassis with the same two fingers.

It is also an object to provide a stanchion that is easy to both install and to remove from the base of a chassis.

To achieve these and other objects, a specially designed stanchion is used together with a specially designed base of a computer chassis. In this invention, the base of the chassis is perforated by a relatively large number of holes such that the number of holes is greater than the number of through holes that perforate a printed circuit board for fastening a printed circuit board to the chassis The result is that not every hole in the base of the chassis is used to fasten a particular printed circuit board to the base of the chassis. Thus, the base of the chassis can accommodate a large number of printed circuit boards having varying through hole arrangements and varying sizes. addition to providing a base portion of a chassis with a large number of mounting holes, this invention uses a specially designed stanchion to mount printed circuit boards to the base of the chassis. The stanchion used in this invention is made of a top portion that is perforated by a through hole to accommodate a screw. On opposite sides of the top portion, a pair of resilient legs extend downward. At the bottoms of each resilient leg, a small metal tab extends parallel to but outward and away from the top portion. The middle portion of each of the resilient legs contains an indentation that extends under the top portion of the stanchion. Placed over the indentations on the outer side of each of the resilient legs are convexly shaped pinching members. A gap exists between the indentation in each of the resilient legs and the pinching members, to facilitate in the elasticity of the stanchions. On the lower portion of each side of each resilient leg extends a retaining member used to secure and fasten the stanchion to the chassis. The retaining member joins the resilient legs at a point on the resilient legs between the indentation and the metal tabs.

The stanchion described in this invention is intended to be installed with two fingers in an aperture perforating the base of a chassis. The installation procedure involves squeezing together the two resilient legs of the stanchion so that the metal tabs can fit through the aperture while not allowing the retaining members to go through the aperture. The fingers are then released, causing the resilient legs to spread apart, causing the edge of the aperture to be sandwiched between the metal tabs and the retaining members. This procedure is repeated for each stanchion until all of the stanchions are attached to the chassis. Next, a perforated printed circuit board is placed over the stanchions. The printed circuit board must be oriented so that the holes perforating the printed circuit board are aligned to the holes perforating the top portions of each of the installed stanchions. Finally, screws are installed into each of the holes on the printed circuit board, attaching the printed circuit board to the stanchions. The result is a printed circuit board that is offset spatially from the base of the chassis while being firmly attached to the chassis. The procedure for disassembly is simply the reverse order of the above described steps for assembly.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein:

FIG. 3 is a view illustrating a computer body with a standoff unit in accordance with an embodiment of the present invention; and FIG. 4 is a detailed cross-sectional view illustrating a computer body with a standoff unit in accordance with a preferred embodiment of the present invention.

DETAILED DESCRIPTION OF THE INVENTION

Figure 1:
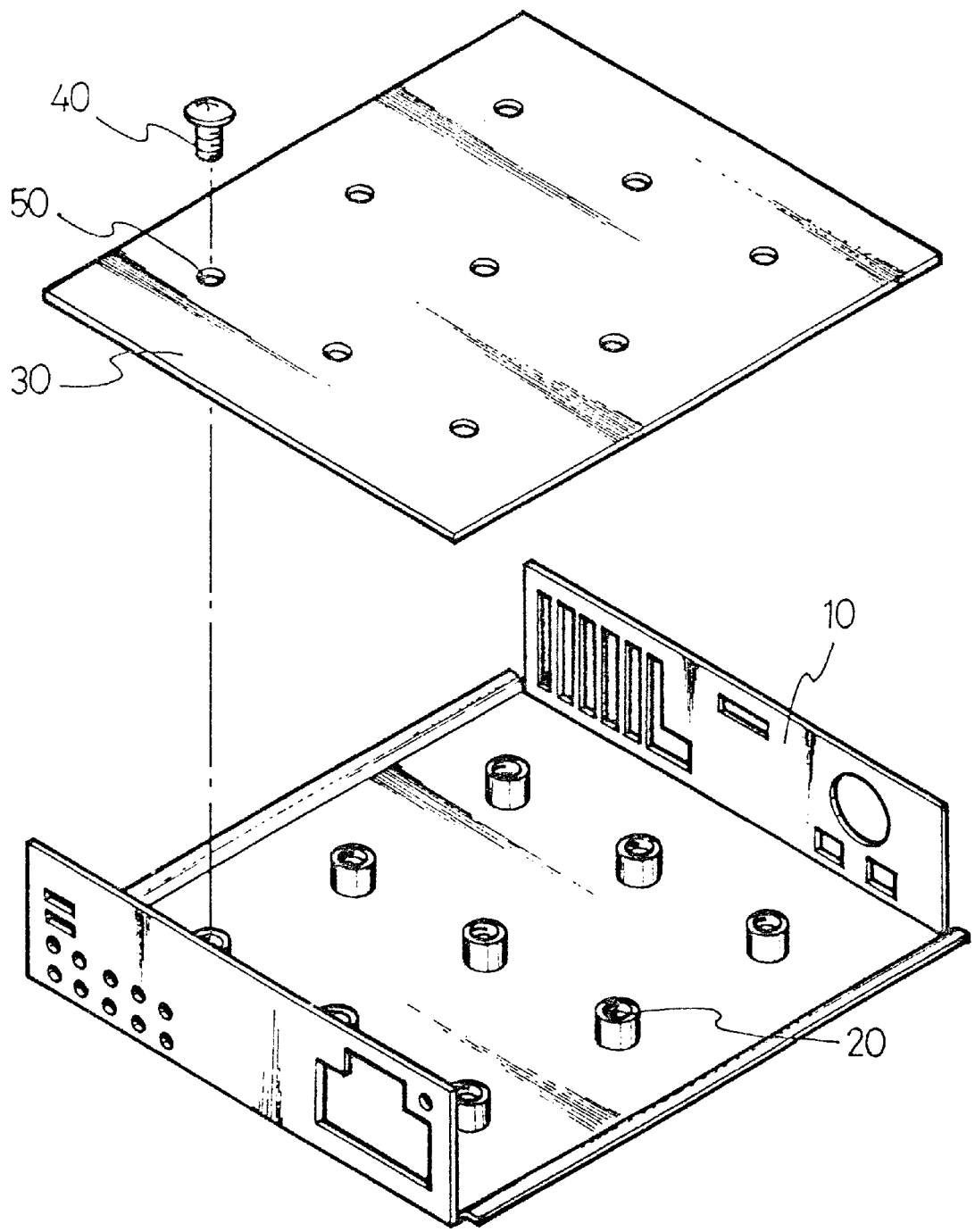
FIG. 1 is a view illustrating a earlier structure of how a motherboard is attached to a chassis of a computer.
Figure 2A:
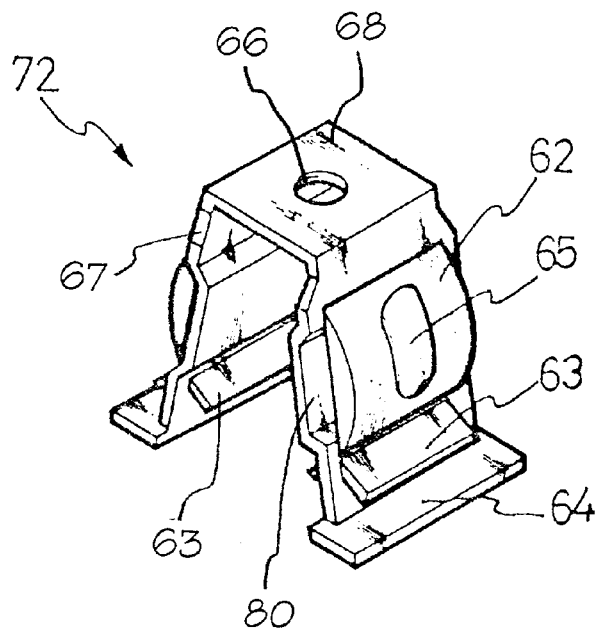
FIG. 2A is a perspective view illustrating a standoff unit in accordance with a preferred embodiment of the present invention.
Figure 2B:
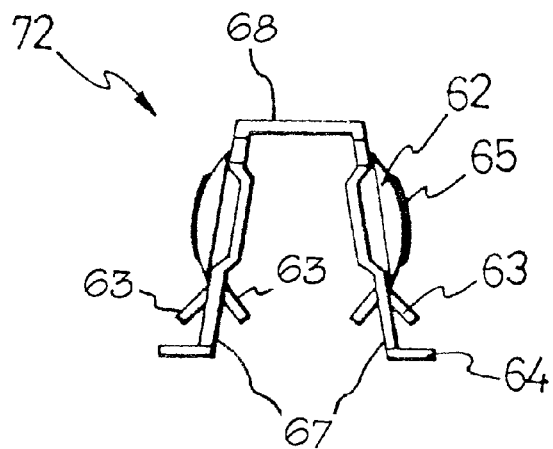
FIG. 2B is a front view illustrating a standoff unit in accordance with a preferred embodiment of the present invention.
Figure 2C:
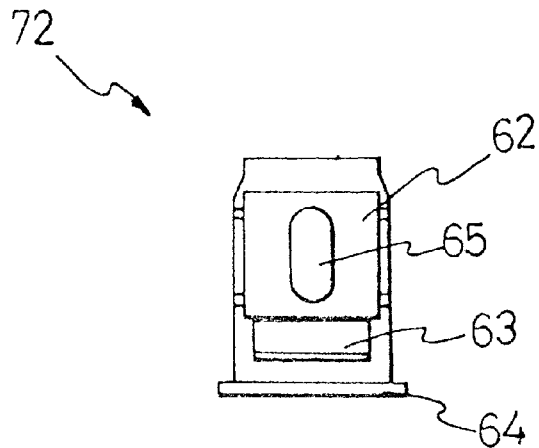
FIG. 2C is a side view illustrating a standoff unit in accordance with a preferred embodiment of the present invention.
Figure 2D:
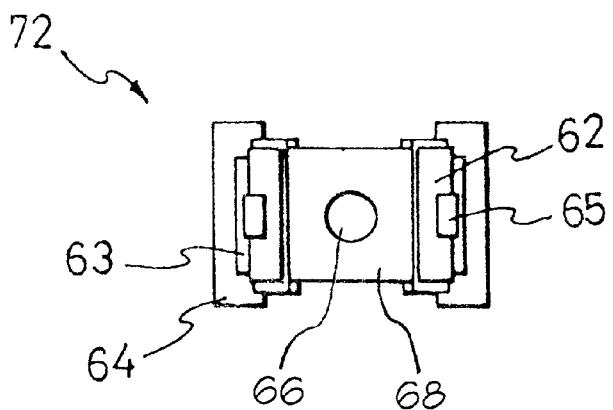
FIG. 2D is a top view illustrating a standoff unit in accordance with a preferred embodiment of the present invention.

Turning to the drawings, FIG. 1 shows a earlier arrangement for mounting a motherboard 30 onto the base portion of the chassis 10 of a computer device. The base portion of the chassis 10 contains a plurality of lugs 20 formed integrally to chassis 10. To create a new arrangement of lugs would involve making an entire new base unit 10 for the chassis.

Also shown in FIG. 1, motherboard 30 contains a plurality of through holes 50 used to accommodate nuts 40 that are used to secure motherboard 30 to chassis 10. The major drawback for this earlier arrangement is that if a new motherboard is substituted where through holes 50 are located at a different location on the motherboard, a new chassis would be required to accommodate for the new hole arrangement on the motherboard.

FIG. 3 shows the mounting arrangement for securing a motherboard 73 to the base portion of a chassis 71 of an electronic computer device according to the present invention. Unlike the earlier arrangement shown in FIG. 1, the arrangement shown in FIG. 3 allows the user to substitute many different motherboards into the same base unit of the chassis. As with the earlier arrangement shown in FIG. 1, motherboard 73 is perforated by a plurality of through holes 76 to accommodate screws 74. Also unlike the earlier chassis, the chassis 71 in FIG. 4 is perforated by a plurality of apertures 75. For the embodiment shown in FIG. 3, the apertures 75 in chassis 71 are of a rectangular shape. These apertures serve to accommodate and secure stanchions 72 placed inside the apertures. The stanchions serve two functions. First, they stand-off or separate the motherboard 73 from the base of the chassis 71 at a predetermined distance. Second, stanchions 72 securely attach motherboard 73 to the chassis 71, so that motherboard 73 does not undergo vibrations and motions within the chassis.

The stanchion used in this invention is unique in that it is a simple part to manufacture and use. The stanchion 72 contains only one part that can be manufactured by stamping and cutting. No molding or assembly is required for making the stanchion used in this invention. Stanchion 72 is also simple to use. To insert or attach it to hole 75 in the base of chassis 71 requires no tools or screws. Elastic pinching members 62 of resilient side supports 67 are squeezed together so that latches 64 can be fit into and under the base plate of chassis 71. Subsequently, the fingers are released from elastic pinching members 62 of resilient side supports 67, allowing resilient side supports 67 to spread apart again causing the periphery of hole 75 to be secured between latch 64 on the underside and retainers 63 on the top side. Thus, by using figure pressure only, stanchion 72 can be placed in and firmly attached to hole 75 of the base of chassis 71. The process of detaching stanchion 72 from hole 75 in chassis 71 works in reverse to that of installation.

One of the novelties of the present invention lies in the design of stanchion 72 and can be seen in FIGS. 2A, 2B, 2C, & 2D. Stanchion 72 is essentially a U-shaped clip made out of a resilient metal. Stanchion 72 contains a top side 68, whose center is perforated by hole 66 to accommodate screw 74. Top side 68 of stanchion 72 has a top surface and a bottom surface. The top surface is contact with motherboard 73 when fully assembled. Extending from opposite ends of the bottom surface of top side 68 are resilient side supports 67. One end of each of these resilient side supports 67 is attached to the bottom surface of top side 68, forming an obtuse angle with the bottom surface of top side 68.

Resilient side supports 67 both contain an inside surface and an outside surface. The inside surfaces of each resilient side support 67 face each other. Opposite the bottom surface of top side 68, the opposite end of resilient side supports 67 are each attached to latches 64. Latches 64 extend from the outer surface of resilient side support 67 at the tip of resilient side support 67 opposite to top side 68. In between these opposite ends of resilient side supports 67 and formed, on the outside surface of resilient side supports 67 are indentations 80. Indentations 80 indent towards the opposite II resilient side support 67 formed on the opposite side of top side 68. Covering the outside surface of indentations 80 are elastic pinching members 62. Elastic pinching members 62 contain a convex outer surface where finger pressure may be applied. The inner surface of elastic pinching member 62 is flat and faces the outside surface of indentation 80. As a result, a gap is formed between the inside surface of elastic pinching member 62 and the outside surface of indentation 80 of resilient side support 67. This gap facilitates the elasticity of stanchion 72 when squeezed or pinched.

The last feature to be described on stanchion 72 are the retainers 63. A pair of retainers extend from each side of resilient side support 67. One retainer extends from the inside surface of resilient side support 67 and the other retainer extends from the outer surface of resilient side support 67. Both retainers extend from the same part of resilient side support 67 between indentation 80 and latch 64. Each retainer forms an acute angle to resilient side support 67. Each retainer 63 extends downward and away from top side 68 and extend towards latch 64. Each retainer 63 is resilient. The purpose of the retainers 63 is to securely fasten the base of chassis 71 to the stanchion 72. As shown in FIG. 4, when properly installed, the periphery of hole 75 in the base of chassis 71 is sandwiched between latch 64 and retainer 63.

The arrangement shown in FIG. 3 using stanchions 72 and a perforated chassis 71 is assembled as follows. First, the stanchions 72 are placed in the proper holes 75 in chassis 71. This is done by squeezing or pinching together elastic pinching members 62 of resilient side supports 67 together, placing the latch portion 64 of the stanchion 72 inside hole 75, and then releasing ones fingers from stanchion 72, allowing the resilient side supports 67 to spread back apart so that latch 64 is underneath the base of chassis 71 while the retainers 63 and the remainder of stanchion 72 extend above hole 75 of chassis 71. Once all the stanchions 72 are in place, motherboard 73 is placed on top of stanchions 72 in such a way that motherboard 73 is oriented so that the through holes 76 of motherboard 73 align with the holes 66 on the top side 68 of stanchions 72. Finally, screws 74 are driven into the motherboard 73 and into hole 66 on top side 68 of stanchion 72, securing motherboard 73 to chassis 71.

One particular benefit of the above arrangement of FIG. 3 is that if a motherboard 73 needs to be interchanged with a new one having a different through hole arrangement 76, it may not be necessary to manufacture or machine out a new chassis 71. In other words, the same chassis 71 can be used for a variety of motherboards. Part of the reason for this is that the number of holes 75 perforating base portion 71 is much greater than the number of holes 76 perforating a typical motherboard 73. Thus, come of the holes 75 in the base portion of the chassis 71 may go unused for a particular application. Thus, if a new motherboard having a different through hole arrangement was to be installed, there is a good probability that the same chassis 71 could be used. Stanchions 72 may have to be moved around for the new application, but it is very possible that the multitude of holes 75 in base portion 71 of the chassis could accommodate the new motherboard arrangement Accordingly, the effect of the present invention lies in that the computer body with a standoff unit makes it easy to assemble and disassemble many kinds of motherboards, that is, main boards, into the single chassis without modifying the motherboards or making a new chassis, thereby improving the productivity. Also, since the stanchion used in the present invention is made out of one part that is stamped and cut, as opposed to a whole assembly of parts, the stanchion in this invention is easy and inexpensive to make.

FIG. 3 shows only one embodiment of the present invention. Other embodiments are also possible, and may require that the holes in the chassis take on a different shape. Thus, this disclosure is not restricted to chassis with just rectangular holes.

Other embodiments of the invention will be apparent to the skilled in the art from consideration of the specification and practice of the invention disclosed herein. It is intended that the specification and examples be considered as exemplary only, with the true scope and spirit of the invention being indicated by the following claims.

What is claimed is:

1. A computer body, comprising:
   a chassis having a base portion perforated by a plurality of chassis holes;
   a plurality of stanchions, fewer in number than the number of said chassis holes, each stanchion inserted into one of said chassis holes, each stanchion comprising:
      a top side having a stanchion hole; and
      a lower portion integral with said top side, said lower portion fitted into the chassis hole, said lower portion comprising:
         two resilient side supports attached angled to said top side of said stanchion to form an approximate U-shape;
         a latch extending from and angled to each resilient side support;
         a retainer extending from each resilient side support between said latch and said top side, said retainer pointing away from said top side of said stanchion; and
         an elastic pinching member on each resilient side support;
   a printed circuit board supported by said top sides of said stanchions, said printed circuit board having a plurality of board holes each aligned coaxially with one of said stanchion holes; and
   a plurality of fasteners each passing through one of said board holes and the aligned stanchion hole to attach said printed circuit board to said stanchions.

2. The computer body of claim 1, further comprising a reinforcement bending portion on said elastic pinching member.

3. A computer body, comprising:
   a chassis having a base portion perforated by a plurality of chassis holes;
   a plurality of stanchions each mounted in one of said chassis holes, each of said stanchions comprising:
      a top side perforated centrally by a stanchion hole, said top side having a top surface and a bottom surface opposite said top surface;
      a pair of resilient side supports each having an inside and an outside surface, said inside surfaces of said pair of resilient side supports facing each other, each of said resilient side supports having a first end and a second end, said first ends of said resilient side support extending from opposite edges of said bottom surface of said top side, each of said first ends forming an obtuse angle to said bottom surface of said top side;

an indentation region on each resilient side support, said indentation region protruding under said top side and in a direction toward the indentation region of the corresponding paired resilient side support;

an elastic pinching member on each resilient side support, said pinching member having a convex outer surface and a flat inner surface, said flat inner surface extending across said indentation region such that a gap is formed between said flat inner surface and said convex outer surface;

two retainers on each resilient side support, one retainer extending from each side of each resilient side support, each retainer having a first end and a second end, said first end of said retainer fixedly attached to and the retainer extending from said resilient side support between said indentation region and said second end of said resilient support, each retainer forming an acute angle to said resilient side support, said second end of said retainer positioned further away from said top side than said first end of said retainer;

a latching member having a first end and a second end, said first end of said latching member being fixedly attached to said second end of said resilient side support such that the second end of the latching members of each resilient side support extends away from the latching member of the corresponding paired resilient side support;

said retainers and said latching members of each resilient side support of each stanchion gripping in a sandwich fashion said base portion of said chassis at the edge of the chassis hole in which the stanchion is mounted;

a printed circuit board having a plurality of board holes, the number of said board holes being the same as the number of said stanchions, said printed circuit board mounted in said chassis resting on the top sides of said stanchions so that each of said board holes aligns with one of said stanchion holes; and a plurality of screws, each screw passing through both one of said board holes and the stanchion hole aligned with said one board hole.

4. The computer body of claim 3 further comprising that each of said elastic pinching members contains a reinforcing bending portion.

5. The computer body of claim 3, further comprising that each of said board holes aligns with one of said chassis holes.

6. The computer body of claim 3, further comprising that said plurality of chassis holes is greater in number than said plurality of board holes, such that not all of said chassis holes have stanchions mounted.

7. The computer body of claim 3, where each of said chassis holes is rectangular.

\* \* \* \* \*